United States Patent
Prophet et al.

(10) Patent No.: US 9,553,057 B1
(45) Date of Patent: Jan. 24, 2017

(54) E-PLANE PROBE WITH STEPPED SURFACE PROFILE FOR HIGH-FREQUENCY

(71) Applicant: HRL Laboratories, LLC, Malibu, CA (US)

(72) Inventors: Eric M. Prophet, Santa Barbara, CA (US); Alexandros D. Margomenos, Pasadena, CA (US); Miroslav Micovic, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 169 days.

(21) Appl. No.: 14/502,347

(22) Filed: Sep. 30, 2014

(51) Int. Cl.
  *H01L 23/66* (2006.01)
  *H01L 21/82* (2006.01)
  *H01P 1/219* (2006.01)

(52) U.S. Cl.
  CPC ............ *H01L 23/66* (2013.01); *H01L 21/82* (2013.01); *H01P 1/219* (2013.01); *H01L 2223/6683* (2013.01)

(58) Field of Classification Search
  CPC .. H01P 5/185; H01L 23/66; H01L 2223/6683; H01L 2223/6627; H01L 21/8213
  USPC ........................................................ 257/275
  See application file for complete search history.

(56) References Cited

U.S. PATENT DOCUMENTS 5,414,394 A * 5/1995 Gamand .............. H01P 5/107 333/26
6,486,748 B1 11/2002 Stones et al.

FOREIGN PATENT DOCUMENTS

EP 1077502 A2 * 2/2001 ............. H01P 5/107

OTHER PUBLICATIONS

Donadio, O., Elgaid, K., and Appleby, R. in "Wavelength-to-Microstrip Transition at a G-Band Using Elevated E-Plane Probe" Electronics Letters, 47(2). pp. 115-116. (2011) ISSN 0013-5194.

K.M. Leong, W. Deal et al. in "A 340-380GHz Integrated CB-CPW-To-Microstrip Transition for Sub mm-Wave MMIC Packaging". IEEE Microwave and Wireless Component Letters, vol. 19, No. 6, Jun. 2009, pp. 413-415.

K.M. Leong, K. Hennig et al. in WR1.5 Silicon Micromachined Waveguide Components and Active Circuit Integration Methodology Theory and Techniques, vol. 60, No. 4, Apr. 2012, pp. 998-1005.

* cited by examiner

*Primary Examiner* — Caridad Everhart
(74) *Attorney, Agent, or Firm* — Ladas & Parry

(57) ABSTRACT

A method of forming an E-plane probe includes forming a plurality of monolithically integrated circuits (MICs) on a wafer, each MIC including a monolithic microwave integrated circuit (MMIC), and an E-plane probe coupled to the MMIC, mounting the wafer on an ultra-violet (UV) tape, cutting the wafer with a laser at a first power and a first linear cutting speed along vertical streets and then along horizontal streets to form separate substrates, cutting with the laser at a second power and a second linear cutting speed a rectangle or a portion of a rectangle from the separate substrates to form narrow substrate extensions on the substrates, and repeating this step for each rectangle or portion of a rectangle to be cut to form substrate extensions, and curing the UV tape, wherein the E-plane probes are on the narrow substrate extensions.

23 Claims, 8 Drawing Sheets

E-PLANE PROBE WITH STEPPED SURFACE PROFILE FOR HIGH-FREQUENCY

STATEMENT REGARDING FEDERAL FUNDING

This invention was made under U.S. Government contract HR0011-09-C-0126. The U.S. Government has certain rights in this invention.

CROSS REFERENCE TO RELATED APPLICATIONS

None

TECHNICAL FIELD

This disclosure relates to E-plane probes and in particular to E-plane probes for interconnection of high frequency integrated circuits with waveguide components.

BACKGROUND

E-plane probes may be used and operate as an antenna that captures the electromagnetic energy propagating in a waveguide to couple the energy to a microelectronic chip, such as a power amplifier. Typically such E-plane probes are fabricated on separate substrates (alumina and quartz) external to the microelectronic chip.

In power modules according to the prior art, a microelectronic chip, such as a power amplifier, may be connected with a ribbon bond to a microstrip E-plane probe fabricated on a low-loss substrate, which may be alumina or quartz. For such modules, the ribbon bond discontinuity and the microstrip transmission line on the low-loss substrate reduce the performance of the module.

FIG. 1 shows an example of the prior art, showing a W-band GaN power amplifier (PA) WR-10 module, which may have 2 Watts of output power at 94 GHz. As shown in FIG. 1, an E-plane probe 12 extends into a WR-10 waveguide 14. WR-10 may be used for microwave W-band frequencies. The E-plane probe 12 along with an impedance matching circuit 16 is mounted on a low-loss substrate 18. A ribbon bond 22 is used to connect the microstrip transmission line 17 to a W-band GaN power amplifier (PA) 20. The ribbon bond 18 discontinuity and the microstrip transmission line 17 on the low-loss substrate 15 could account for a reduction of over 1 dB in performance.

More recently, and especially for very high frequency operations, such probes have been integrated monolithically on the microelectronic chip.

For example, Donadio, O., Elgaid, K., and Appleby, R. in "Waveguide-to-microstrip transition at G-band using elevated E-plane probe *Waveguide-to-microstrip transition at G-band using elevated E-plane probe*" Electronics Letters, 47 (2). pp. 115-116. (2011) ISSN 0013-5194 describe a G-band waveguide-to-microstrip transition which is elevated over GaAs substrate; however, the described transition is fabricated with a fabrication process which is not compatible with conventional monolithic microwave integrated circuit (MMIC) processes and requires non-standard micro fabrication steps.

U.S. Pat. No. 6,486,748, issued Nov. 26, 2002 to Stones et al., describes a low-loss transition from microstrip to waveguide using a suspended stripline as an intermediate connection; however, the described transition is fabricated using materials and a fabrication process which again is not compatible with conventional MMIC processes and requires non-standard micro fabrication steps.

K. M. Leong, W. Deal et al. in "A 340-380 GHz Integrated CB-CPW-to-Microstrip Transition for Sub mm-Wave MMIC packaging", IEEE Microwave and Wireless Components Letters, vol. 19, no. 6, June 2009, pp. 413-415 describe a monolithically integrated E-plane probe for InP substrates. The design described utilizes the entire width of the substrate for the E-plane probe. The disadvantage of such a structure is that because the entire substrate width is used for the E-plane probe, there is a large leakage of the trans-electric $TE_{10}$ mode in the waveguide into the circuit, which reduces the circuit performance.

K. M. Leong, K. Henning et al. in "WR1.5 Silicon Micromachined Waveguide Components and Active Circuit integration Methodology", IEEE Trans. on Microwave Theory and Techniques, vol. 60, no. 4, April 2012, pp. 998-1005 describe a monolithically integrated E-plane probe on a InP substrate. The fabrication uses deep reactive ion etching to form the E-plane probe. The approach works with thin substrates; however, does not work with substrate thicknesses greater than 50 um. As a result, deep reactive ion etching cannot create free-standing high aspect ratio structures.

What is needed is an improved way to fabricate E-plane probes for interconnecting high frequency (>100 GHz) microelectronic chips, such as GaN, InP, Si, SiC, GaAs or other technologies with waveguide components. The embodiments of the present disclosure answer these and other needs.

SUMMARY

In a first embodiment disclosed herein, a method of forming an E-plane probe comprises forming a plurality of monolithically integrated circuits on a wafer, each monolithically integrated circuit comprising a monolithic microwave integrated circuit (MMIC) formed on the wafer, and an E-plane probe coupled to the MMIC, the E-plane probe formed on the wafer, mounting the wafer on an ultra-violet (UV) tape, cutting the wafer with a laser at a first power and a first linear cutting speed along vertical streets and then along horizontal streets, the vertical and horizontal streets separating each monolithically integrated circuit onto a separate substrate cut from the wafer, turning the laser off and directing the laser via the previously cut vertical and horizontal streets to a location to cut a rectangle or a portion of a rectangle from one or more of the separate substrates to form one or more narrow substrate extensions on one or more of the substrates, turning the laser on while the laser is positioned on a vertical or horizontal street, cutting with the laser at a second power and a second linear cutting speed a rectangle or a portion of a rectangle from one or more of the separate substrates to form one or more narrow substrate extensions on one or more of the substrates, repeating for each rectangle or portion of a rectangle to be cut the steps of turning the laser off and directing the laser via the previously cut vertical and horizontal streets to a location to cut a rectangle or a portion of a rectangle from one or more of the separate substrates to form one or more narrow substrate extensions on one or more of the substrates, turning the laser on while the laser is positioned on a vertical or horizontal street, and cutting with the laser at a second power and a second linear cutting speed a rectangle or a portion of a rectangle from one or more of the separate substrates to form one or more narrow substrate extensions on one or more of the substrates, and curing the ultra-violet (UV) tape to remove each monolithically integrated circuit from the UV tape, wherein the E-plane probes are on the narrow substrate extensions.

In another embodiment disclosed herein, an electronic device comprises a monolithically integrated circuit comprising a monolithic microwave integrated circuit (MMIC) formed on a substrate, and an E-plane probe coupled to the MMIC, the E-plane probe formed on the substrate, wherein the E-plane probe is coupled to the MMIC by a microstrip transmission line on the substrate, wherein the substrates have a non-rectangular form and the E-plane probe is on a narrow extension of the substrate, and wherein the non-rectangular form and the narrow extension of the substrate is formed by laser cutting.

These and other features and advantages will become further apparent from the detailed description and accompanying FIG.s that follow. In the FIG.s and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed present disclosure may be practiced without all of the specific details discussed below. In other instances, well known features have not been described so as not to obscure the present disclosure.

The present disclosure describes a method for fabricating E-plane probes for interconnecting high frequency (>100 GHz) microelectronic chips, such as GaN, InP, Si, SiC, GaAs or other high speed integrated circuits, with waveguide components. By integrating the E-plane probe on-wafer with a high frequency chip, a ribbon bond discontinuity is eliminated and the loss from the transmission line connecting the probe to the chip is minimized. The method of fabricating the E-plane probe of the present disclosure is fully compatible with standard monolithic microwave integrated circuit (MMIC) processes.

Figure 1:
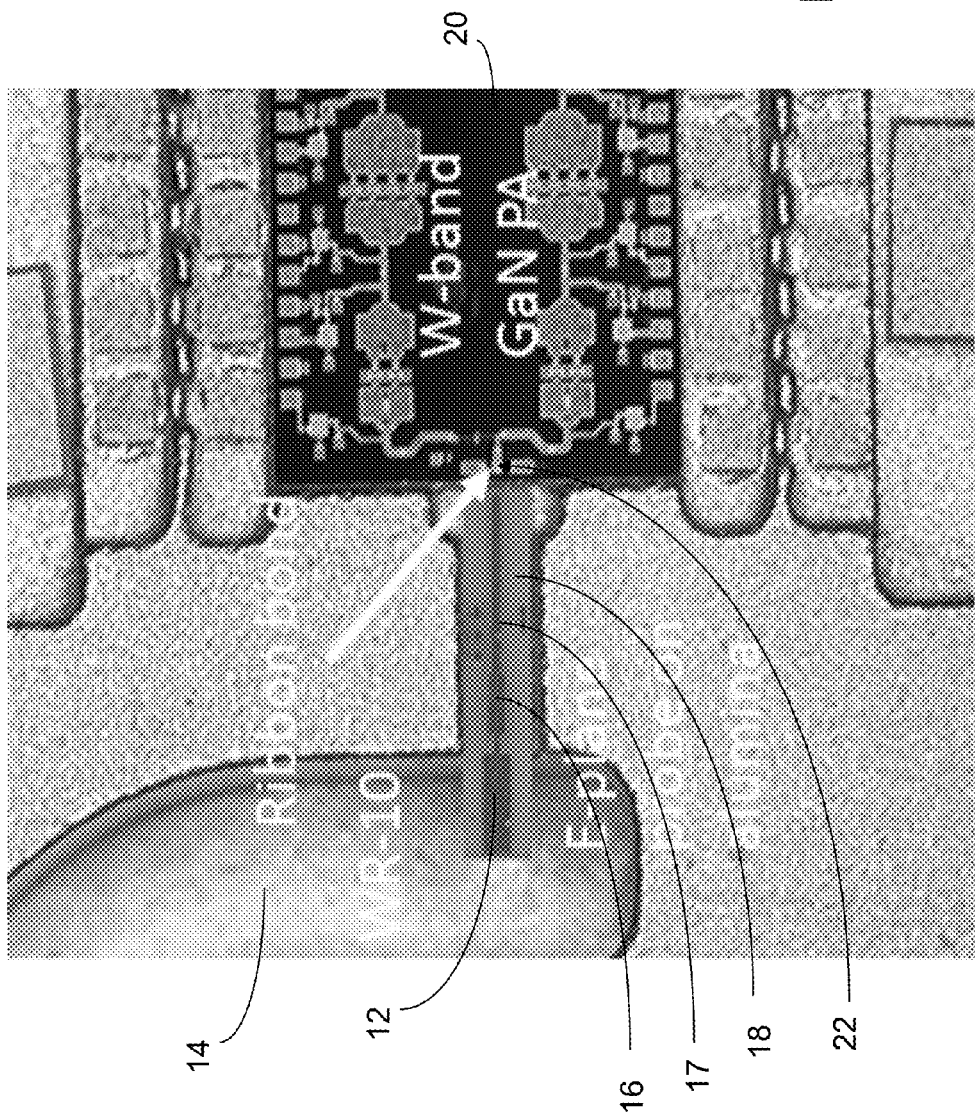
FIG. 1 shows an example of a W-band GaN power amplifier (PA) WR-10 module in accordance with the prior art.
Figure 2:
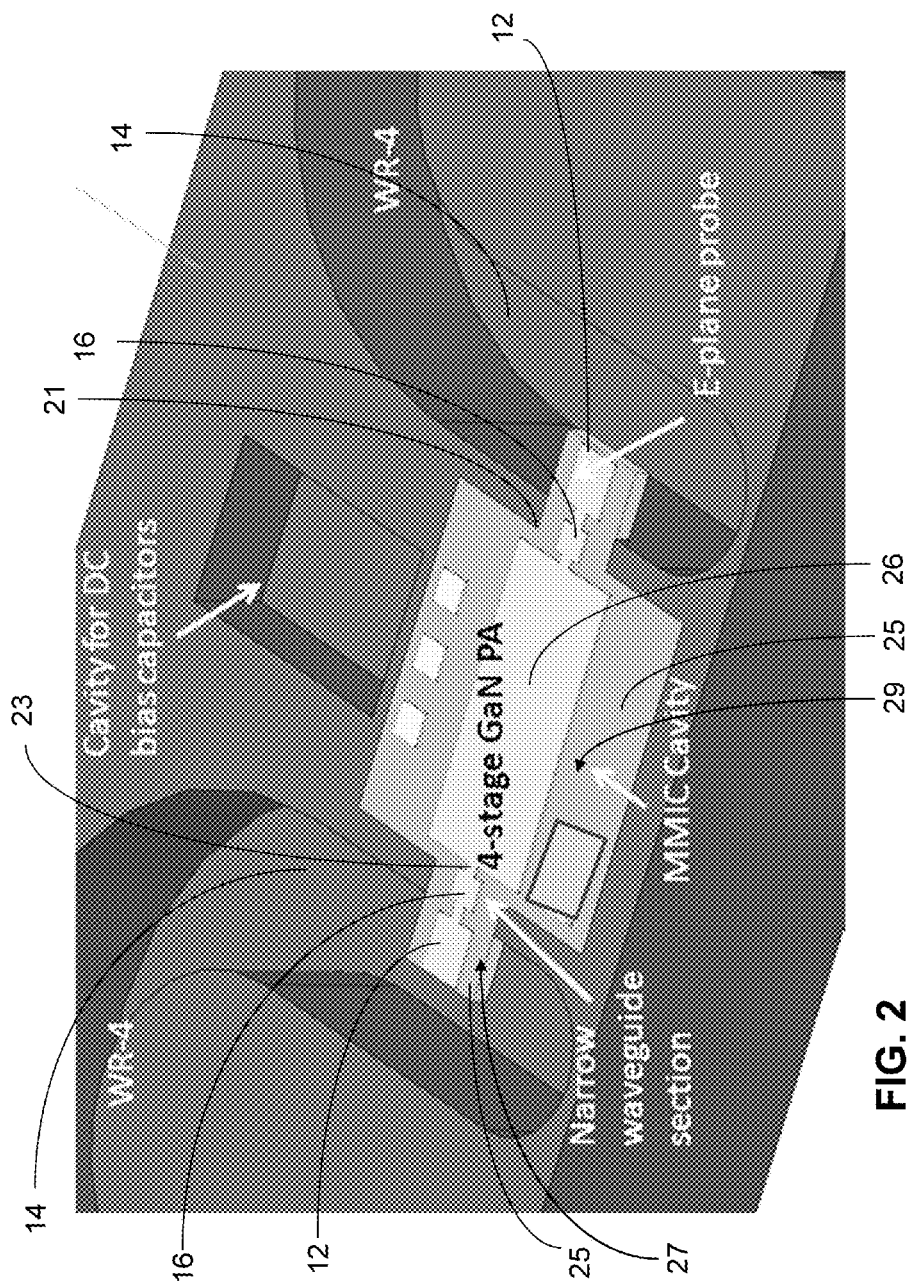
FIG. 2 shows an E-plane probe monolithically integrated with a circuit on a common non-rectangular substrate in accordance with the present disclosure.

FIG. 2 shows an E-plane probe 12 and impedance matching circuit 16 monolithically integrated with a MMIC circuit 26, which is shown as a PA 26, but could be any circuit, on a common non-rectangular substrate 25 in accordance with the present disclosure. The PA 26 may be for operation at G-band, which is 231.5-235 GHz. Because the E-plane probe 12 and MMIC 26 are on the same substrate 25, the connection between the E-plane probe 12 and MMIC 26 is by a microstrip transmission line 23 on the same substrate 25, which eliminates the ribbon wire discontinuity of the prior art.

Because the substrate 25 for the MMIC 26 may be a high dielectric constant substrate, such as SiC with $\epsilon_r=10.4$, a key challenge is to prevent leakage of the $TE_{10}$ mode from the WR-4 waveguide 14, which is used for G-band frequencies, into the PA 26 via the substrate 25. Because the substrate 25 has a very narrow and long extension 27 onto which the E-plane probe 12 is formed, leakage of the TE10 mode into the chip cavity is minimized.

The narrow extension 27 can fit inside a very small waveguide aperture. Preferably, the waveguide aperture is made as small as possible to prevent perturbing the electric field distribution within the waveguide.

By fabricating the E-plane probe 12 on a narrow extension 27, operation at much higher frequencies is possible. For high-frequency microstrip waveguides, it is preferable to use thin substrates and narrow microstrip transmission lines. For G-Band applications and higher, the substrate 25, according to the present disclosure, may have a thickness of 25 microns or less, and the narrow extensions 27 may have a width of 175 microns or less. Thicker substrates may also be made, which have thicknesses of 20 to 75 microns.

In the present disclosure, laser machining is used to form asymmetric substrates to allow fabrication of an E-plane probe, matching network and MMIC circuitry on a common non-rectangular substrate 25 with one or more narrow extensions 27 for E-plane probe 12. The substrate may be GaN on SiC, SiC, Si, InP, GaAs, alumina, quartz, or other suitable substrates. The substrates may have a wide range of thicknesses.

The asymmetric substrates may have a non-rectangular die shape. A laser cutting tool, such as a Synova LCS300, may be used to form narrow substrate extensions 27 at the location of the E-plane probes. The narrow substrate extensions 27 reduce the high dielectric constant material of the substrate around the E-plane probe, which improves the radio frequency (RF) performance.

Also, a narrow waveguide section, into which the narrow substrate extension 27 with the E-plane probe may be inserted, may be used to separate a waveguide, such as a WR-4 waveguide, from a cavity for the MMIC. This narrow waveguide section may have a cut-off frequency above the operational bandwidth of the MMIC, therefore acting as an evanescent mode filter that further reduces the leakage of the $TE_{10}$ mode into the MMIC.

Figure 3:
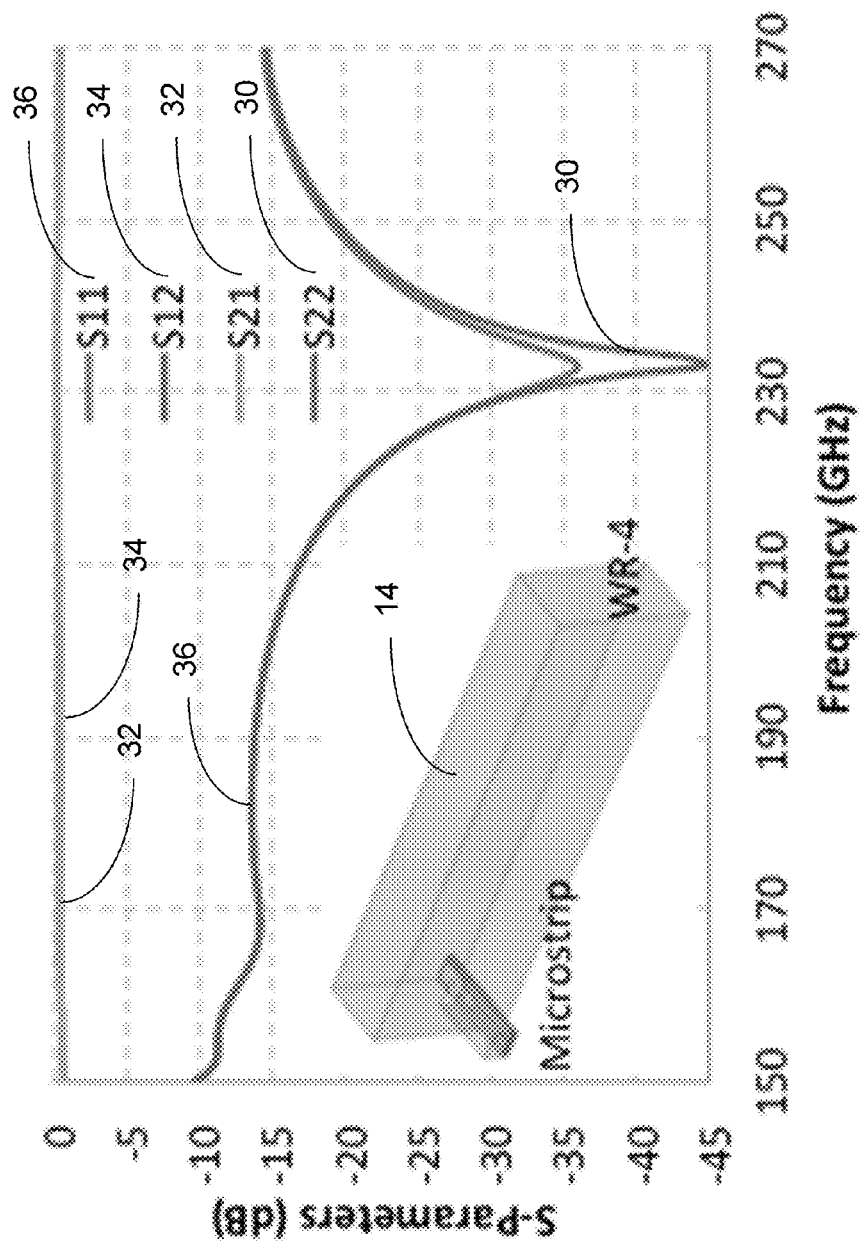
FIG. 3 shows a simulated resonance-free response of a back-to-back E-plane probe inside a waveguide cavity in accordance with the present disclosure.

FIG. 3 shows a response using a circuit simulator for the structure inset in FIG. 3. The estimated loss of the E-plane probe is 0.28 dB for the bandwidth of 150-270 GHz, defined by a S11/S22 of 10 dB and better over 150-270 GHz. The structure includes port 1 to a WR-4 waveguide, and port 2 to a microstrip line on a 50 µm thick SiC substrate.

Figure 4A:
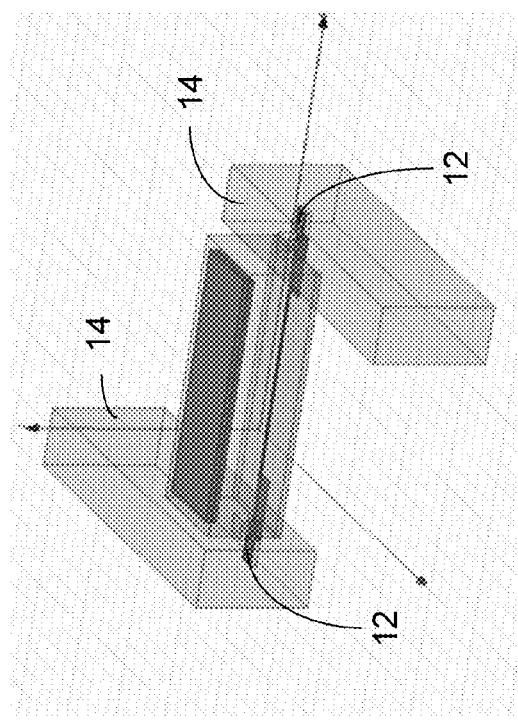
FIG. 4A shows a simulated response of a back-to-back E-plane probe on a 50 µm SiC substrate encapsulated inside a waveguide cavity as shown in FIG. 4B in accordance with the present disclosure.
Figure 4B:
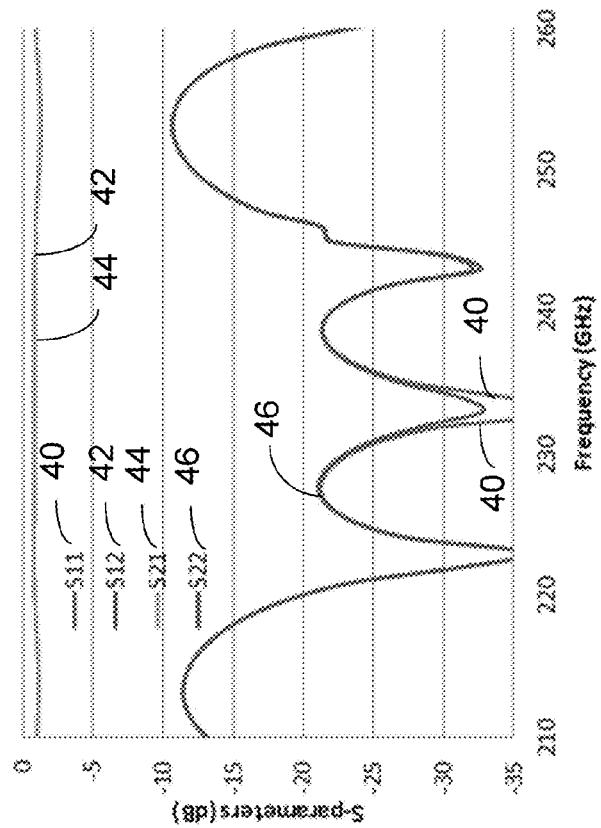

FIG. 4A shows the simulated response of a back-to-back E-plane probe 12 on a 50 µm SiC substrate encapsulated inside a waveguide 14, as shown in FIG. 4B. In order to suppress any cavity resonances the top wall of the cavity may be machined to form structures that shift all resonances outside of the frequency band of operation. FIG. 4B shows an example with a 200 μm capacitive post that has a resonant-free operation from 210-260 GHz.

Substrates 25 with E-plane probe 12, impedance matching circuit 16, and a MMIC 26 monolithically integrated may be fabricated according to the following process. First, MMIC processing is used to fabricate on a wafer a plurality of monolithically integrated circuits 29, such as shown in FIG. 2, each having an E-plane probe 12, an impedance matching circuit 16, and a MMICs 26. The wafer may be thinned before or after fabricating the plurality of monolithically integrated circuits 29. Then the wafer may be mounted onto a very high-tack ultra-violet (UV) tape 65 to hold the monolithically integrated circuits 29 securely during the laser cutting process.

Then a laser may be used to mechanically isolate each monolithically integrated circuit. Once the laser cutting is done, the monolithically integrated circuits may be separated from the UV tape 65 by curing the UV tape 65 with UV.

Figure 5:
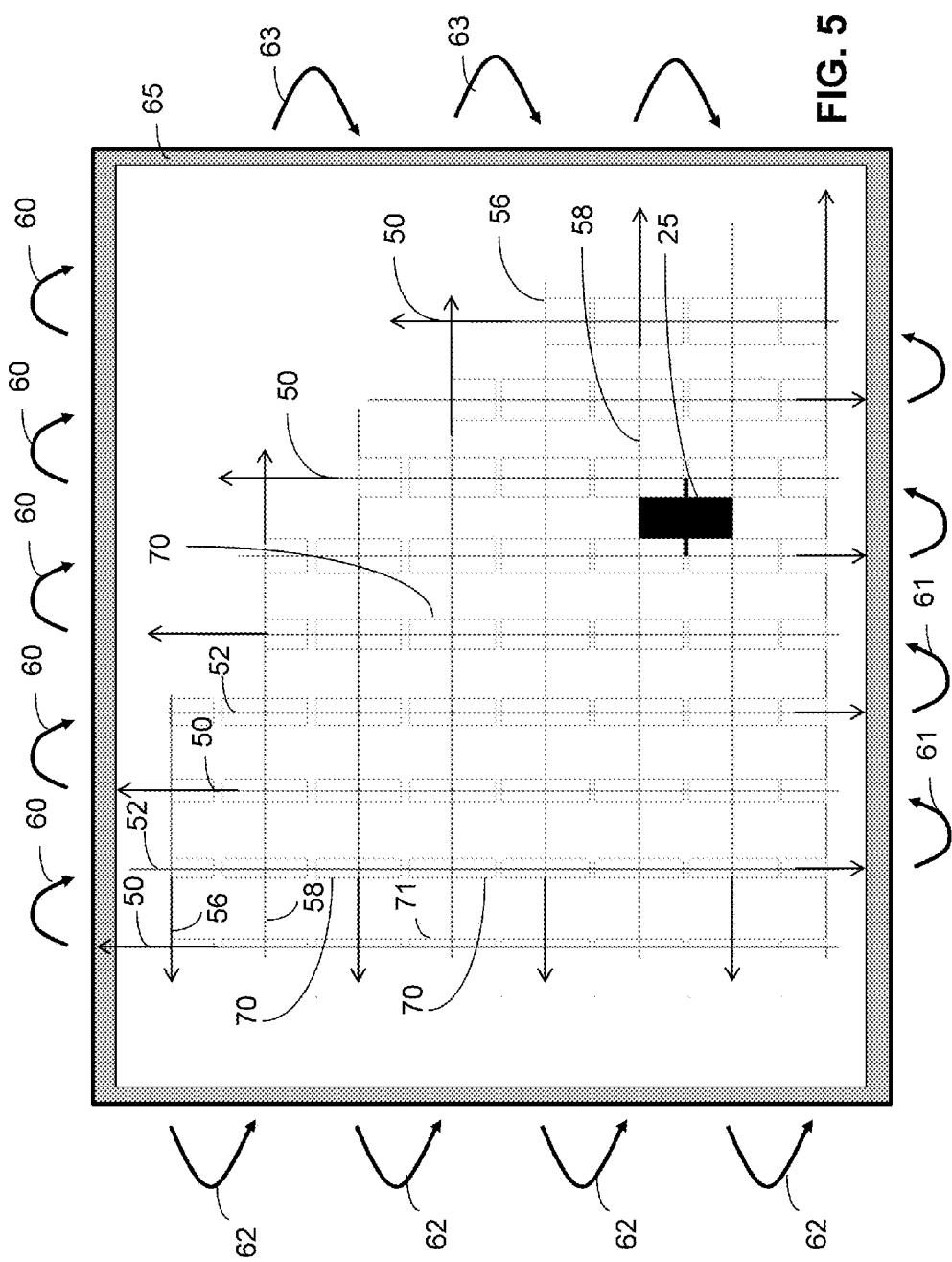
FIG. 5 shows a layout for cutting of non-rectangular die segments for E-plane probes in accordance with the present disclosure.

FIG. 5 shows a layout for cutting an array of monolithically integrated circuits 29 with E-plane probes 12.

First, cuts are made with a laser along vertical streets 50 and 52 and horizontal streets 56 and 58. A laser cutting program operating on a computer, directs the laser and the high-pressure water-jet laser waveguide along the streets 50, 52, 56 and 58 in order to prevent the high-pressure water-jet waveguide from damaging the fragile substrates 25 and the monolithically integrated circuits 29. The horizontal cuts along vertical streets 50 and 52 are cut in serpentine fashion. For example, the laser cuts along a vertical street 50, which is oriented in a vertical up direction, and then is turned off while turned around as indicated by turnaround 60, and then the laser is turned back on to cut along a vertical street 52, which is oriented in a vertical down direction, as shown in FIG. 5. Once the cut along vertical street 52 is complete, the laser is again turned off while turned around as indicated by turnaround 61, and then the laser is turned back on to cut along a vertical street 50. The laser cutting continues in a serpentine manner, and the result is a set of separated rectangular die, which are held together by the UV tape 65, which is not cut.

For a SiC substrate with a thickness of 50 μm, the horizontal and vertical cuts may be made using a moderately low power of just 4-Watts and a linear cutting speed of 25 mm/s. Two passes may be needed to fully cut through the substrate; however, the laser power is such that the UV tape 65 is not cut, so the individual separated rectangular die stay together on the UV tape 65.

After the rectangular dies have been singulated using the horizontal and vertical serpentine cutting patterns along vertical streets 50 and 52 and horizontal streets 56 and 58, the laser is turned off, and is returned to a start location, which may be an origin on a grid, by way of the previously cut vertical streets 50 and 52 and horizontal streets 56 and 58. It is important that the laser is returned by way of the previously cut vertical streets 50 and 52 and horizontal streets 56 and 58 in order to prevent the high-pressure water-jet waveguide from damaging the fragile substrates 25 and the monolithically integrated circuits 29.

Next, the laser power and linear cutting speed are adjusted for further cuts of the substrate 25, to form the narrow substrate extensions 27 at the location of the E-plane probes 12. For the previous example of a SiC substrate, the laser power may be adjusted to 3-Watts and the linear cutting speed may be dropped to just 5 mm/sec. The slower cutting speed is necessary to form a less rounded inside corner radius at location 21 shown in FIG. 2, which allows the substrate 25 to maintain a close proximity to the waveguide 14, which minimizes leakage. The slower cutting speed also is necessary so that a proper cutting depth is attained at the lower laser power. Again, the cutting depth is such that the UV tape 65 is not cut. Only a single pass may be used for this step in order to prevent overexposure and substrate 25 cracking.

The laser shutter remains closed while the laser transitions from cut section to cut section in order to avoid excessive laser exposure and potentially cutting through the UV tape 65. To begin the cut for the narrow substrate extensions 27, the laser while turned off is directed via the previously cut vertical streets 50 and 52, or horizontal streets 56 and 58 to a rectangle 70 or 71, as shown in FIG. 5, to be cut to form the narrow substrate extensions 27. Note that in the case of a rectangle 71, only three sides of the rectangle 71 needs to be cut, because the fourth side is a street 50 or 52 that has already been cut. It is important that the laser is directed to the rectangle 70 or 71 by way of the previously cut vertical streets 50 and 52 and horizontal streets 56 and 58 in order to prevent the high-pressure water-jet waveguide from damaging the fragile substrates 25 and the monolithically integrated circuits 29.

Once at a rectangle 70 or 71, the laser is turned on while the laser waveguide is still inside a previously cut vertical street 50 or 52, or horizontal street 56 or 58 to avoid the substrate 25 from cracking due to the laser turn on impact.

Figure 6:
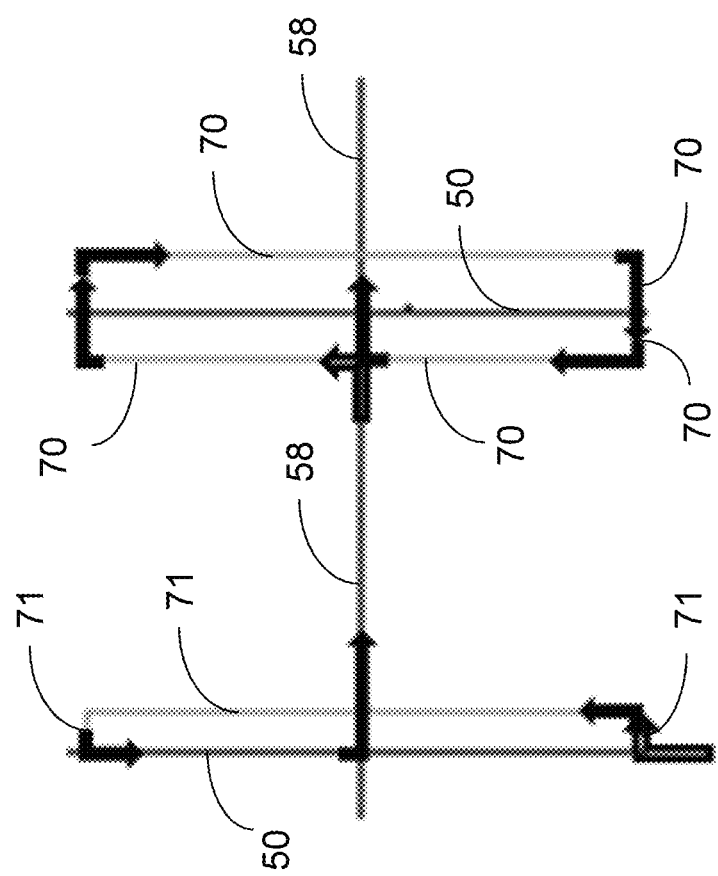
FIG. 6 shows the direction of a cutting path for forming high-aspect ratio E-plane probe tabs in accordance with the present disclosure.

FIG. 6 shows the cutting path used for cutting the rectangle 70 or 71. Once these cuts are made the result is a set of singulated or separated substrates 25, as shown in FIG. 5, which are still held on the UV tape 65. After the laser cuts of a rectangle, such as rectangle 71, the process repeats. The laser is turned off and the laser is directed via the previously cut vertical streets 50 and 52, or horizontal streets 56 and 58 to another rectangle, such as rectangle 70 to be cut to form the narrow substrate extensions 27.

After the substrate cuts have been completed, the UV tape 65 is exposed using an ultra-violet light source for a sufficient amount of time to provide the proper dosage to cure the UV tape 65. The tack on the UV tape 65 after curing is reduced by a factor of more than 100. The small, very thin substrates 25 with the monolithically integrated circuits 29 may then be easily removed without damaging the high-aspect ratio E-plane probes.

Figures 7A, 7B:
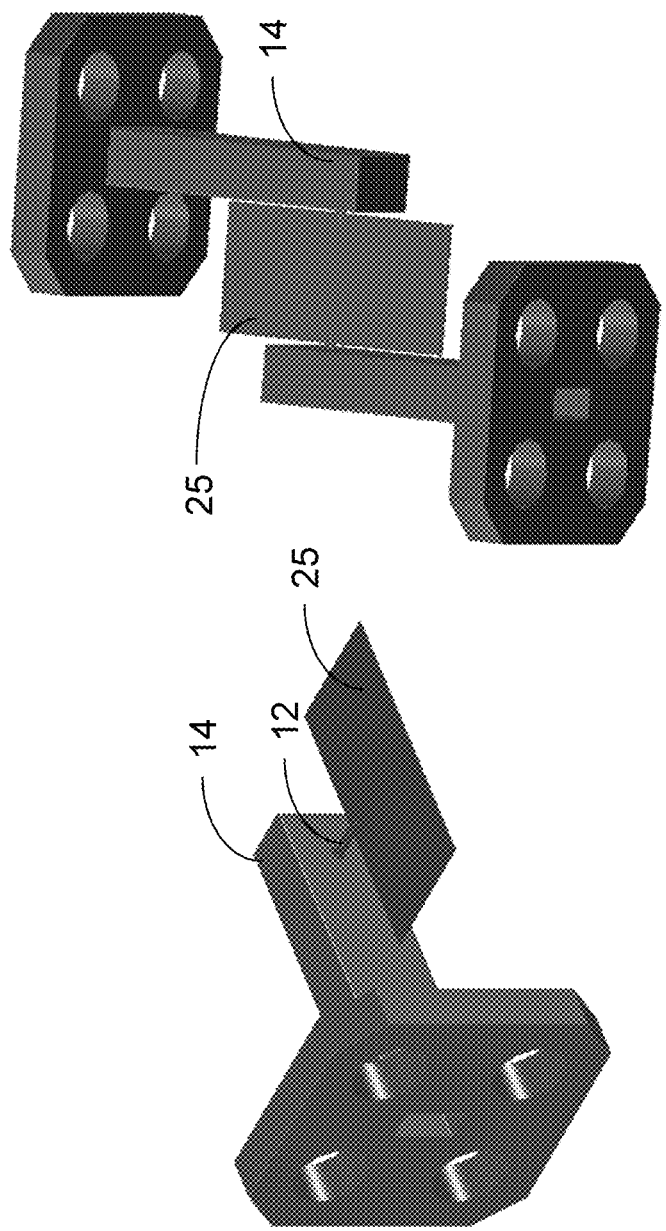
FIGS. 7A and 7B show representations of laser machined E-plane probes coupled into a G-band rectangular waveguide segment in accordance with the present disclosure.
Figure 8:
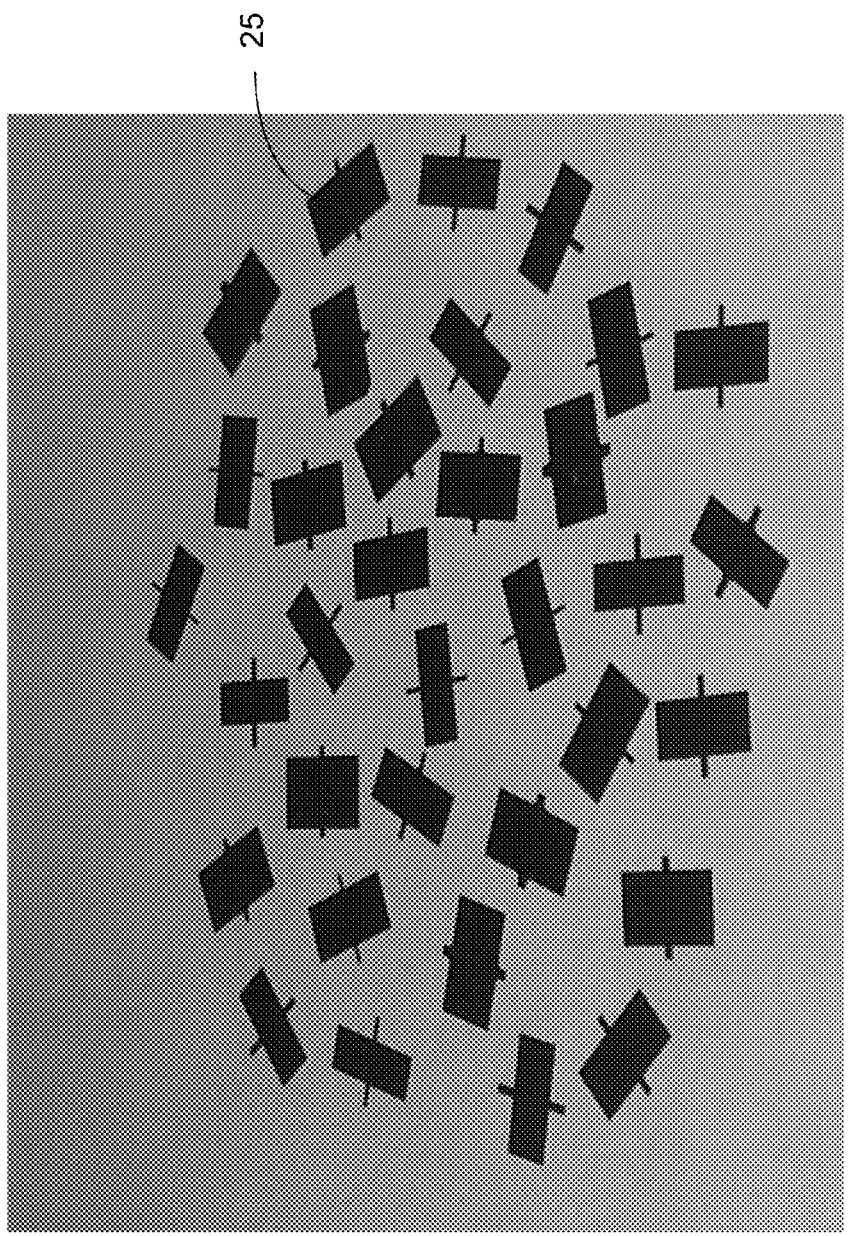
FIG. 8 shows multiple fabricated non-rectangular substrate with various aspect ratios diced from a single substrate in accordance with the present disclosure.

FIGS. 7A and 7B show AutoCAD representations of laser machined substrates 25 with E-plane probes 12 launching into G-band rectangular waveguides 14. FIG. 8 shows multiple example fabricated substrates with narrow substrate extensions 27 for E-plane probes 12 with various aspect ratios diced.

Using the methods of the present disclosure, monolithically integrated high-aspect ratio, free-standing E-plane probes may be fabricated on microelectronic chips, such as GaN, SiC, Si, InP, GaAs by using laser micromachining. By integrating the probes monolithically on-wafer, the need is eliminated for wirebonds or ribbon bonds connecting the microelectronic chip to the E-plane probe. The process allows the formation of high aspect, which means narrow and long, substrate sections, which can support E-plane probes, which is critical because the narrow substrate allows the formation of narrow waveguide sections which can suppress the leakage of the main TE10 mode from the waveguide to the cavity where the microelectronic chip is placed. The described fabrication process allows for the formation of arbitrary shaped chips in thin microwave substrates using laser micromachining. The described laser dicing process also allows the formation of high aspect ratio free-standing structures without threatening the mechanical integrity of the thinned SiC substrate.

Having now described the present disclosure in accordance with the requirements of the patent statutes, those skilled in this art will understand how to make changes and modifications to the present invention to meet their specific requirements or conditions. Such changes and modifications may be made without departing from the scope and spirit of the present disclosure as disclosed herein.

The foregoing Detailed Description of exemplary and preferred embodiments is presented for purposes of illustration and disclosure in accordance with the requirements of the law. It is not intended to be exhaustive nor to limit the present disclosure to the precise form(s) described, but only to enable others skilled in the art to understand how the present disclosure may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the present disclosure be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of forming an E-plane probe comprising:
    forming a plurality of monolithically integrated circuits on a wafer, each monolithically integrated circuit comprising:
        a monolithic microwave integrated circuit (MMIC) formed on the wafer; and
        an E-plane probe coupled to the MMIC, the E-plane probe formed on the wafer;
    mounting the wafer on an ultra-violet (UV) tape;
    cutting the wafer with a laser at a first power and a first linear cutting speed along vertical streets and then along horizontal streets, the vertical and horizontal streets separating each monolithically integrated circuit onto a separate substrate cut from the wafer;
    turning the laser off and directing the laser via the previously cut vertical and horizontal streets to a location to cut a rectangle or a portion of a rectangle from one or more of the separate substrates to form one or more narrow substrate extensions on one or more of the substrates;
    turning the laser on while the laser is positioned on a vertical or horizontal street;
    cutting with the laser at a second power and a second linear cutting speed a rectangle or a portion of a rectangle from one or more of the separate substrates to form one or more narrow substrate extensions on one or more of the substrates;
    repeating for each rectangle or portion of a rectangle to be cut the steps of:
        turning the laser off and directing the laser via the previously cut vertical and horizontal streets to a location to cut a rectangle or a portion of a rectangle from one or more of the separate substrates to form one or more narrow substrate extensions on one or more of the substrates;
        turning the laser on while the laser is positioned on a vertical or horizontal street; and
        cutting with the laser at a second power and a second linear cutting speed a rectangle or a portion of a rectangle from one or more of the separate substrates to form one or more narrow substrate extensions on one or more of the substrates; and
    curing the ultra-violet (UV) tape to remove each monolithically integrated circuit from the UV tape;
    wherein the E-plane probes are on the narrow substrate extensions.

2. The method of claim 1 wherein the monolithically integrated circuits comprise one or more of GaN, InP, Si, SiC, or GaAs.

3. The method of claim 1 wherein:
    the wafer has a thickness of 25 microns or less; and
    the narrow substrate extensions have a width of 175 microns or less.

4. The method of claim 1 wherein the wafer has a thickness of 20 to 75 microns.

5. The method of claim 1 wherein the first power is greater than the second power and the first linear cutting speed is greater than the second linear cutting speed.

6. The method of claim 1 wherein:
    the wafer comprises SiC having a thickness of 50 mm;
    the first power is 4 Watts;
    the first linear cutting speed is 25 mm/second;
    the second power is 3 Watts; and
    the second linear cutting speed is 5 mm/second.

7. The method of claim 1 wherein:
    cutting the wafer with the laser at the first power and the first linear cutting speed along vertical streets and then along horizontal streets comprises directing the laser from in a serpentine fashion between the vertical streets and in a serpentine fashion between the horizontal streets.

8. The method of claim 1 wherein each E-plane probe is coupled to a respective MMIC by a microstrip transmission line on the substrate.

9. The method of claim 1 wherein each monolithically integrated circuit further comprises:
    an impedance matching circuit coupled between the E-plane probe and the MMIC.

10. The method of claim 1 wherein the second linear cutting speed is set to reduce an inside corner radius for the narrow substrate extension.

11. The method of claim 1 further comprising
    mounting the narrow substrate extension into a waveguide.

12. The method of claim 1 wherein an operating frequency of each monolithically integrated circuit is in a range from 231.5 to 235 GHz.

13. The method of claim 1 wherein the MMIC comprises a power amplifier.

14. The method of claim 1 wherein:
the narrow substrate extension has a length that is greater than a width of the narrow substrate extension; and
the MMIC is on a portion of the substrate with a width that is greater than the width of the narrow extension.

15. An electronic device comprising:
a substrate having a thickness and a non-rectangular form, the non-rectangular form of the substrate comprising a first portion of the substrate and at least one narrow extension of the substrate extending from the first portion;
a monolithic microwave integrated circuit (MMIC) on the first portion of the substrate;
an E-plane probe on the at least one narrow extension of the substrate; and
a microstrip transmission line on the substrate coupled between the E-plane probe and the monolithic microwave integrated circuit (MMIC).

16. The device of claim 15 further comprising:
an impedance matching circuit coupled between the E-plane probe and the MMIC.

17. The device of claim 15 wherein the monolithically integrated circuit comprises one or more of GaN, InP, Si, SiC, or GaAs.

18. The device of claim 15 wherein:
the thickness of the substrate is 25 microns or less; and
the at least one narrow extension of the substrate has a width of 175 microns or less.

19. The device of claim 15 wherein the substrate has a thickness of 20 to 75 microns.

20. The device of claim 15 wherein an operating frequency of the monolithically integrated circuit is in a range from 231.5 to 235 GHz.

21. The device of claim 15 wherein the MMIC comprises a power amplifier.

22. The device of claim 15 wherein:
the narrow extension of the substrate has a length that is greater than a width of the narrow extension; and
the first portion of the substrate has a width that is greater than the width of the narrow extension.

23. The device of claim 15 wherein the narrow extension of the substrate is continuous with the first portion of the substrate on only one edge of the narrow extension.

* * * * *